(12) United States Patent
Li et al.

(10) Patent No.: US 9,214,645 B1
(45) Date of Patent: Dec. 15, 2015

(54) INVERTED TOP EMITTING DEVICE AND METHOD FOR PRODUCING SAME

(71) Applicant: EverDisplay Optronics (Shanghai) Limited, Shanghai (CN)

(72) Inventors: Yanhu Li, Shanghai (CN); Xinzhi Lin, Shanghai (CN); Bin Zhang, Shanghai (CN); Guifang Li, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days.

(21) Appl. No.: 14/494,061

(22) Filed: Sep. 23, 2014

(30) Foreign Application Priority Data

Aug. 1, 2014 (CN) .......................... 2014 1 0378135

(51) Int. Cl.
*H01L 51/52* (2006.01)
*H01L 51/00* (2006.01)
*C01D 7/00* (2006.01)
*H01L 51/56* (2006.01)
*H01L 51/50* (2006.01)

(52) U.S. Cl.
CPC .............. *H01L 51/5221* (2013.01); *C01D 7/00* (2013.01); *H01L 51/006* (2013.01); *H01L 51/0021* (2013.01); *H01L 51/0072* (2013.01); *H01L 51/0085* (2013.01); *H01L 51/5206* (2013.01); *H01L 51/56* (2013.01); *H01L 51/5016* (2013.01); *H01L 51/5056* (2013.01); *H01L 51/5072* (2013.01); *H01L 2251/303* (2013.01); *H01L 2251/308* (2013.01); *H01L 2251/5315* (2013.01); *H01L 2251/558* (2013.01)

(58) Field of Classification Search
CPC ............ H01L 51/0007; H01L 51/0059; H01L 51/5092; H01L 51/5234; H01L 51/5265; H01L 51/5271; H01L 51/5293
See application file for complete search history.

(56) References Cited

U.S. PATENT DOCUMENTS

2009/0026925 A1* 1/2009 Uehara .......................... 313/504

* cited by examiner

*Primary Examiner* — Kyoung Lee
(74) *Attorney, Agent, or Firm* — Wang Law Firm, Inc.; Li K. Wang; Stephen Hsu

(57) ABSTRACT

An inverted top emitting device includes an TIO/Ag/ITO substrate, a cathode layer, an electron transport layer, an emissive layer, a hole transport layer, and an anode layer. The TIO/Ag/ITO substrate, the cathode layer, the electron transport layer, the emissive layer, the hole transport layer, and the anode layer are stacked in sequence. The cathode layer is made of cesium carbonate. The inverted top emitting device and its producing method provided by the present invention change the current structure of ITO/Ag/ITO/HTL/EML/ETL/Mg:Ag of the device to ITO/Ag/ITO/Cs$_2$CO$_3$/ETL/EML/HTL/MoO$_3$/Ag. This avoids use of low work function metals, such as magnesium. Thus, even if the encapsulation is not satisfactory, the device is less likely to be oxidized by water and oxygen, providing the device with a longer service life.

9 Claims, 2 Drawing Sheets

INVERTED TOP EMITTING DEVICE AND METHOD FOR PRODUCING SAME

CROSS REFERENCE TO RELATED APPLICATION

The present invention claims the benefit of priority to CN 201410378135.1, filed on Aug. 1, 2014 with the State Intellectual Property Office of the People's Republic of China, the entire specification of which is hereby incorporated by reference.

BACKGROUND OF THE INVENTION

The present invention relates to an organic electroluminescent light-emitting diode (OLED) device and, more particularly, to an inverted top emitting device and a method for producing the inverted top emitting device.

Development of organic light-emitting diodes (OLEDs) haven received wide attention from the science research institutes and industries in recent years. OLED displays have entered people's lives, but the service life of OLEDs is an importance issue of survival. Current OLED devices generally use a high work function metal as the anode and use a low work function metal as the cathode. However, the low work function metal is apt to oxidize. Furthermore, encapsulation of the device is extremely important if the encapsulation face is at the low work function location. However, the service life of OLED devices is still short.

Nowadays, OLEDs have achieved wide application. FIG. 1 shows a currently industrialized top emitting diode. ITO/Ag/ITO is used as the anode. An Mg—Ag alloy formed by co-evaporation of magnesium (a low work function metal) and silver (a high work function metal with stable chemical properties) is used as the cathode. Encapsulation then proceeds. Specifically, the ITO/Ag/ITO substrate is accomplished by an array process. Then, an OLED evaporation process is carried out to proceed with evaporation of the hole injection layer, the hole transmission layer, the emissive layer, the electron transport layer, and the electron injection layer. Finally, evaporation of the Mg—Ag alloy on the cathode is carried out. Next, encapsulation of the device proceeds. Since magnesium is a low work function active metal, it is apt to react with water and oxygen and, thus, damages the cathode of the device, shortening the service life of the OLED device.

BRIEF SUMMARY OF THE INVENTION

An objective of the present invention is to overcome the disadvantage of short service life of OLED devices by using ITO/Ag/ITO/Cs$_2$CO$_3$/ETL/EML/HTL/MoO$_3$/Ag to avoid easy oxidization of magnesium.

The technical problem to be solved by the present invention is fulfilled by the following technical solutions.

An inverted top emitting device according to the present invention includes an TIO/Ag/ITO substrate, a cathode layer, an electron transport layer, an emissive layer, a hole transport layer, and an anode layer. The TIO/Ag/ITO substrate, the cathode layer, the electron transport layer, the emissive layer, the hole transport layer, and the anode layer are stacked in sequence. The cathode layer is made of cesium carbonate.

Preferably, the cathode layer is doped with an alkali metal salt, and the alkali metal salt is cesium fluoride, cesium azide or lithium fluoride.

Preferably, cesium carbonate has a thickness of 1-5 nm.

Preferably, the electron transport layer is made of 1,3,5-tris(1-phenyl-1H-benzimidazol-2-yl)benzene, the emissive layer is made of 4,4-N,N'-dicarbazole-1,1'-biphenyl doped with 2% of Ir(ppy)3, and the hole transport layer is made of N,N'-bis-(1-naphthalenyl)-N,N'-bis-phenyl-(1,1'-biphenyl)-4,4'-diamine.

Preferably, the anode layer is made of molybdenum oxide/silver.

Preferably, the electron transport layer has a thickness of 30-50 nm, the emissive layer has a thickness of 35-40 nm, the hole transport layer has a thickness of 55-60 nm, a thickness of molybdenum oxide is 1-20 nm, and a thickness of silver is 10-20 nm.

A method for producing an inverted top emitting device according to the present invention includes: (1) preparing an ITO/Ag/ITO substrate; (2) forming a cathode layer of cesium carbonate on the ITO/Ag/ITO substrate; (3) forming an electron transport layer, an emissive layer, and a hole transport layer on the cathode layer in sequence; and (4) forming an anode layer on the hole transport layer.

Preferably, preparing the ITO/Ag/ITO substrate includes ultrasonic cleaning the ITO/Ag/ITO substrate with a detergent and deionized water and drying the ITO/Ag/ITO substrate. Preferably, the layer of cesium carbonate is deposited on the ITO/Ag/ITO substrate by evaporation and has a thickness of 1-5 nm. Preferably, the cathode layer is doped with an alkali metal salt, and wherein the alkali metal salt is cesium fluoride, cesium azide or lithium fluoride.

Preferably, the electron transport layer is made of 1,3,5-tris(1-phenyl-1H-benzimidazol-2-yl)benzene and has a thickness of 30-35 nm, the emissive layer is made of 4,4-N,N'-dicarbazole-1,1'-biphenyl doped with 2% of Ir(ppy)3 and has a thickness of 35-40 nm, and the hole transport layer is made of N,N'-bis-(1-naphthalenyl)-N,N'-bis-phenyl-(1,1'-biphenyl)-4,4'-diamine and has a thickness of 55-60 nm.

Preferably, the anode layer is made of molybdenum oxide/silver, wherein a thickness of molybdenum oxide is 1 nm to 20 nm, and a thickness of silver is 10 nm to 20 nm.

The inverted top emitting device and its producing method provided by the present invention change the current structure of ITO/Ag/ITO/HTL/EML/ETL/Mg:Ag of the device to ITO/Ag/ITO/Cs$_2$CO$_3$/ETL/EML/HTL/MoO$_3$/Ag. This avoids use of low work function metals, such as magnesium. Thus, even if the encapsulation is not satisfactory, the device is less likely to be oxidized by water and oxygen, providing the device with a longer service life.

The present invention will be further described in connection with the accompanying drawings and specific embodiments.

DETAILED DESCRIPTION OF THE INVENTION

Figure 2:
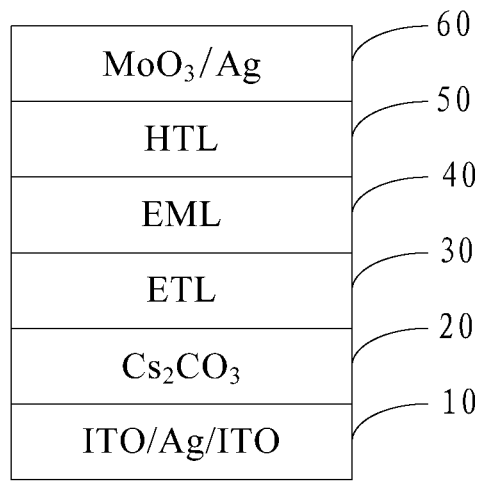
FIG. 2 is a schematic structural view of an inverted top emitting device according to the present invention.

FIG. 2 shows a schematic structural view of an inverted top emitting device according to the present invention. The inverted top emitting device includes an TIO/Ag/ITO substrate 10, a cathode layer 20, an electron transport layer 30, an emissive layer 40, a hole transport layer 50, and an anode layer 60. The TIO/Ag/ITO substrate 10, the cathode layer 20, the electron transport layer 30, the emissive layer 40, the hole transport layer 50, and the anode layer 60 are stacked in sequence. The cathode layer is made of cesium carbonate.

The ITO/Ag/ITO substrate 10 is a multilayer thin-film structure formed of transparent conductive ITO layers and a highly reflective and highly conductive sliver layer. The ITO/Ag/ITO substrate 10 includes an inner ITO film, a silver film, and an outer ITO film in sequence. Since silver tends to oxide easily, the silver film is sandwiched between two ITO films, with a side of the silver film bonded to the inner ITO film and with the other side of the silver film bonded to the outer ITO film, avoiding oxidation of silver.

The cathode layer 20 is made of cesium carbonate ($Cs_2CO_3$). Since the electron injection principle of cesium carbonate is forming a dipole layer on the cathode to achieve better electron injection, cesium carbonate is deposited on the ITO by evaporation to reduce the work function of ITO, thereby obtaining an ideal electron injection performance. By depositing cesium carbonate on the ITO/Ag/ITO substrate 10 to serve as the cathode layer 20 of the device, use of low work function metals (such as magnesium) can be avoided to reduce erosion by water and oxygen, increasing the service life. In this embodiment, the cesium carbonate layer has a thickness of 1-5 nm, preferably 3 nm.

Furthermore, the cathode layer 20 is doped with an alkali metal salt to serve as an electron injection material for the cathode layer 20. The alkali metal salt is cesium fluoride (CsF), cesium azide ($CsN_3$) or lithium fluoride (LiF), preferably lithium fluoride. The electron injection layer has a thickness of 0.5-10 nm, preferably 1 nm.

The electron transport layer is made of TPBI, namely, 1,3,5-tris(1-phenyl-1H-benzimidazol-2-yl)benzene.

The emissive layer 40 is made of 4,4-N,N'-dicarbazole-1,1'-biphenyl doped with 2% of Ir(ppy)3. In this embodiment, Ir(ppy)3 is a phosphorescent complex, namely, tris(2-phenylpyridine)iridium, which is a phosphorescent dye. It is a light emitting material with excellent light emitting properties.

The hole transport layer is made of N,N'-bis-(1-naphthalenyl)-N,N'-bis-phenyl-(1,1'-biphenyl)-4,4'-diamine.

The anode layer 60 is made of molybdenum oxide/silver ($MoO_3$/Ag). Specifically, it is a composite film layer including a layer of silver film on a layer of molybdenum oxide film.

In this embodiment, the electron transport layer 30 has a thickness of 30-35 nm, the emissive layer 40 has a thickness of 35-40 nm, the hole transport layer 50 has a thickness of 55-60 nm, the thickness of molybdenum oxide is 1-20 nm, and the thickness of silver is 10-20 nm. In the most preferred form, the thickness of electron transport layer 30 is 30 nm, the thickness of the emissive layer 40 is 40 nm, the thickness of the hole transport layer 50 is 60 nm, the thickness of molybdenum oxide is 10 nm, and the thickness of silver is 15 nm.

Figure 3:
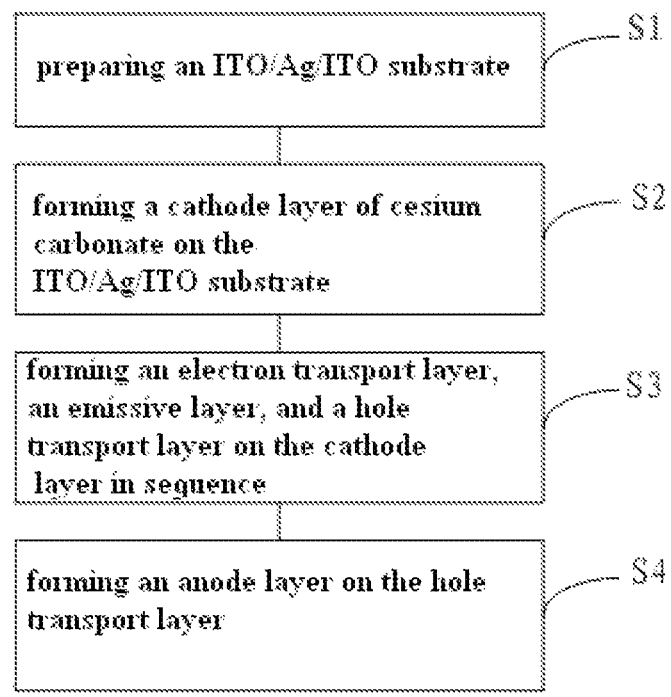
FIG. 3 is a diagram illustrating steps of a method for producing the inverted top emitting device according to the present invention.

FIG. 3 is a diagram illustrating steps of a method for producing the inverted top emitting device according to the present invention. The method for producing an inverted top emitting device includes preparing an ITO/Ag/ITO substrate 10 (the first step S1). In this embodiment, preparing the ITO/Ag/ITO substrate 10 (the first step S1) includes ultrasonic cleaning the ITO/Ag/ITO substrate 10 with a detergent and deionized water and drying the ITO/Ag/ITO substrate 10.

Then, a cathode layer 20 of cesium carbonate is formed on the ITO/Ag/ITO substrate 10 (the second step S2). In this embodiment, cesium carbonate is deposited on the ITO/Ag/ITO substrate 10 by evaporation and is doped with alkali metal salt (cesium fluoride and lithium fluoride) as the electron injection material. The thickness of cesium carbonate is 1-5 nm, preferably 5 nm.

Furthermore, the cathode layer 20 is doped with an alkali metal slat as the electron injection material. The alkali metal salt can be cesium fluoride, cesium azide, or lithium fluoride. In this embodiment, the alkali metal salt is preferably lithium fluoride. The thickness of the electron injection layer is 0.5-10 nm, preferably 1 nm.

Next, an electron transport layer 30, an emissive layer 40, and a hole transport layer 50 are formed on the cathode layer 20 in sequence (the third step S3). Specifically, the electron transport layer 30, the emissive layer 40, and the hole transport layer 50 are stacked by evaporation. The electron transport layer 30 is made of 1,3,5-tris(1-phenyl-1H-benzimidazol-2-yl)benzene and has a thickness of 30-35 nm. The emissive layer 40 is made of 4,4-N,N'-dicarbazole-1,1'-biphenyl doped with 2% of Ir(ppy)3 and has a thickness of 35-40 nm. The hole transport layer 50 is made of N,N'-bis-(1-naphthalenyl)-N,N'-bis-phenyl-(1,1'-biphenyl)-4,4'-diamine and has a thickness of 55-60 nm.

Then, an anode layer 60 is formed on the hole transport layer 50 (the fourth step S4). In this embodiment, the anode layer 60 is made of molybdenum oxide/silver. The thickness of molybdenum oxide is 1 nm to 20 nm, and the thickness of silver is 10-20 nm.

Figure 1:
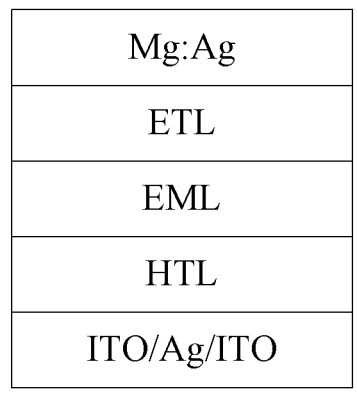
FIG. 1 is a schematic structural view of a top emitting device according to current technique.

The embodiment of the present invention will be further described by reference to FIGS. 1 and 2. FIG. 1 is a device according to current technique, whereas FIG. 2 is a device after improvement. In both devices, the material of the hole transport layer (HTL) is N,N'-bis-(1-naphthalenyl)-N,N'-bis-phenyl-(1,1'-biphenyl)-4,4'-diamine, the material of emissive layer is 4,4-N,N'-dicarbazole-1,1'-biphenyl (CBP) doped with 2% of Ir(ppy)3, and the material of electron transport layer is 1,3,5-tris(1-phenyl-1H-benzimidazol-2-yl)benzene. Since the main design of the present invention is the anode structure and the cathode structure, the materials of the other layers other than the anode and cathode are not the only choice; namely, materials frequently used in the current technique can be used for replacement.

In the inverted top emitting device, the thickness of cesium carbonate is about 1-5 nm, preferably 3 nm. Cesium carbonate is an effective electron injection material and is widely used in OLED devices. Since its electron injection principle is forming a dipole layer at the cathode, a better electron injection can be achieved. Furthermore, it can be deposited on ITO by evaporation to reduce the work function of ITO, thereby obtaining an ideal electron injection performance. Thus, ITO/Ag/ITO/$Cs_2Co_3$ is used as the cathode of the device to avoid use of low work function metals (such as magnesium), erosion resulting from water and oxygen is reduced to prolong the service life.

In the two devices, the thickness of the electron transport layer (ETL) is 30 nm, the thickness of the emissive layer (EML) is 40 nm, the thickness of the hole transport layer (HTL) is 60 nm, the thickness of molybdenum oxide ($MoO_3$) is preferably 10 nm, and the thickness of silver is preferably 15 nm. Furthermore, the emissive face is the $MoO_3$/Ag face, because absorption of molybdenum oxide in the visible region is lesser and, thus, will not much affect the light output rate.

The inverted top emitting device and its producing method provided by the present invention change the current structure of ITO/Ag/ITO/HTL/EML/ETL/Mg:Ag of the device to ITO/Ag/ITO/$Cs_2CO_3$/ETL/EML/HTL/$MoO_3$/Ag. This avoids use of low work function metals, such as magnesium. Thus, even if the encapsulation is not satisfactory, the device is less likely to be oxidized by water and oxygen, providing the device with a longer service life.

Although the invention has been described in connection with the embodiments shown in the accompanying drawings, a person having ordinary skill in the art can make various modifications to the invention based on the above descriptions. Therefore, some details of the embodiment should not be construed to restrict the invention. The scope of the invention is limited by the accompanying claims.

The invention claimed is:

1. An inverted top emitting device comprising a cathode layer made of cesium carbonate, wherein the cathode layer is doped with an alkali metal salt, and the alkali metal salt is cesium fluoride, cesium azide or lithium fluoride.

2. The device according to claim 1, wherein cesium carbonate has a thickness of 1-5 nm.

3. The device according to claim 2 further comprising an electron transport layer made of 1,3,5-tris(1-phenyl-1H-benzimidazol-2-yl)benzene, an emissive layer is made of 4,4-N,N'-dicarbazole-1,1'-biphenyl doped with 2% of Ir(ppy)3, and a hole transport layer made of N,N'-bis-(1-naphthalenyl)-N,N'-bis-phenyl-(1,1'-biphenyl)-4,4'-diamine.

4. The device according to claim 1 further comprising an anode layer made of molybdenum oxide/silver.

5. The device according to claim 3, wherein the electron transport layer has a thickness of 30-50 nm, the emissive layer has a thickness of 35-40 nm, the hole transport layer has a thickness of 55-60 nm, a thickness of molybdenum oxide is 1-20 nm, and a thickness of silver is 10-20 nm.

6. A method for producing an inverted top emitting device comprising the steps of:

preparing an ITO/Ag/ITO substrate;

forming a cathode layer of cesium carbonate on the ITO/Ag/ITO substrate;

forming an electron transport layer, an emissive layer, and a hole transport layer on the cathode layer in sequence; and forming an anode layer on the hole transport layer.

7. The method as claimed in claim 6, wherein the step of preparing the ITO/Ag/ITO substrate includes ultrasonic cleaning the ITO/Ag/ITO substrate with a detergent and deionized water and drying the ITO/Ag/ITO substrate, wherein the layer of cesium carbonate is deposited on the ITO/Ag/ITO substrate by evaporation and has a thickness of 1-5 nm, wherein the cathode layer is doped with an alkali metal salt, and wherein the alkali metal salt is cesium fluoride, cesium azide or lithium fluoride.

8. The method as claimed in claim 7, wherein the electron transport layer is made of 1,3,5-tris(1-phenyl-1H-benzimidazol-2-yl)benzene and has a thickness of 30-35 nm, the emissive layer is made of 4,4-N,N'-dicarbazole-1,1'-biphenyl doped with 2% of Ir(ppy)3 and has a thickness of 35-40 nm, and the hole transport layer is made of N,N'-bis-(1-naphthalenyl)-N,N'-bis-phenyl-(1,1'-biphenyl)-4,4'-diamine and has a thickness of 55-60 nm.

9. The method as claimed in claim 6, wherein the anode layer is made of molybdenum oxide/silver, wherein a thickness of molybdenum oxide is 1 nm to 20 nm, and a thickness of silver is 10 nm to 20 nm.

* * * * *